(12) United States Patent
Jindal

(10) Patent No.: US 8,855,962 B2
(45) Date of Patent: Oct. 7, 2014

(54) SYSTEM FOR TESTING ELECTRONIC CIRCUITS

(75) Inventor: Deepak Jindal, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 492 days.

(21) Appl. No.: 13/401,847

(22) Filed: Feb. 22, 2012

(65) Prior Publication Data

US 2013/0218508 A1 Aug. 22, 2013

(51) Int. Cl.
*G06F 19/00* (2011.01)
*G01R 31/3185* (2006.01)
*G01R 31/317* (2006.01)
*G01R 31/3177* (2006.01)
*G05B 1/00* (2006.01)
*G01R 31/3163* (2006.01)
*G01R 31/30* (2006.01)
*G01R 31/28* (2006.01)

(52) U.S. Cl.
CPC .......... *G05B 1/00* (2013.01); *G01R 31/318575* (2013.01); *G01R 31/318577* (2013.01); *G01R 31/31721* (2013.01); *G01R 31/3177* (2013.01); *G01R 31/28* (2013.01); *G01R 31/3163* (2013.01); *G01R 31/318536* (2013.01); *G01R 31/30* (2013.01)
USPC ............ 702/120; 702/117; 714/729; 714/733

(58) Field of Classification Search
CPC .................... G01R 31/31721; G01R 31/3177; G01R 31/318575; G01R 31/318577; G01R 31/318536; G01R 31/30; G01R 31/28; G01R 31/3163; G05B 1/00
See application file for complete search history.

(56) References Cited

U.S. PATENT DOCUMENTS

| | | | |
|---|---|---|---|
| 4,521,879 A * | 6/1985 | Gueldenpfennig et al. | .. 370/267 |
| 4,524,444 A * | 6/1985 | Efron et al. | .................... 714/735 |
| 5,226,048 A | 7/1993 | Bandali et al. | |
| 5,383,143 A | 1/1995 | Crouch | |
| 5,471,481 A * | 11/1995 | Okumoto et al. | ............. 714/727 |
| 5,610,826 A * | 3/1997 | Whetsel | ........................ 702/117 |
| 5,617,431 A | 4/1997 | Tupuri | |
| 5,781,718 A | 7/1998 | Nguyen | |
| 6,160,413 A | 12/2000 | Habersetzer | |
| 6,255,836 B1 * | 7/2001 | Schwarz et al. | ........... 324/750.3 |
| 6,769,080 B2 * | 7/2004 | Whetsel | ........................ 714/729 |
| 6,826,100 B2 | 11/2004 | Ellis | |
| 7,058,862 B2 * | 6/2006 | Whetsel et al. | ................. 714/30 |
| 7,272,756 B2 | 9/2007 | Brink | |
| 7,647,539 B2 | 1/2010 | Bussa | |

* cited by examiner

*Primary Examiner* — Carol S Tsai
(74) *Attorney, Agent, or Firm* — Charles Bergere

(57) ABSTRACT

A system for testing electronic circuits includes first, second, and third standard interfaces. A test port master and a test port slave are connected to an external testing apparatus. The first, second, and third standard interfaces are tested in first, second, and third test modes, respectively. The tests are initiated by asserting a test mode activate and first, second, and third test mode enable signals, respectively, which enable reuse of test patterns across different electronic circuits.

19 Claims, 3 Drawing Sheets

SYSTEM FOR TESTING ELECTRONIC CIRCUITS

BACKGROUND OF THE INVENTION

The present invention generally relates to testing electronic circuits, and, more particularly, to re-use of test patterns for testing electronic circuits.

A system-on-chip (SoC) includes several standard interfaces that communicate with external hardware devices using standard communication protocols such as Universal Serial Bus (USB) interfaces, enhanced triple-speed Ethernet controller (ETSEC)/1588 interfaces, display interface unit (DIU) interfaces, synchronous serial interfaces (SSI), serial peripheral interfaces (SPI), and time-division multiplexing (TDM) interfaces. Since silicon is prone to defects, testing interfaces for accuracy of operation is of utmost importance before the SoC is shipped to customers. Testing involves several checks to ensure that the interfaces receive and transmit data to and from the external hardware devices accurately. An example of such tests is AC characterization (AC-Cz).

AC-Cz is performed to estimate input and output (I/O) specifications of a standard interface. The I/O specifications include measurements of input setup/hold values and output valid/hold values and must match with predetermined specifications for smooth and error free communication. A variation between the measurements and predetermined specifications indicates a fault in the circuitry implementing the standard interface.

Many times, identical standard interfaces installed in various SoCs, also known as re-use interfaces, require different sets of test patterns for testing. The differences may exist in power-on-reset (POR) configuration values, design bus architecture, design gaskets, design frequency of operation, pin-multiplexing arrangements, and pad activities of the SoCs. Since test patterns are cycle accurate, the above differences lead to repetition of the same test pattern generation activity across different SoCs at different time instances, making it imperative to generate different sets of test patterns for test re-use interfaces across different SoCs. For example, USB interfaces installed in Freescale Semiconductor™ P1022 and P1023 chips require different test patterns for AC-Cz. Architectural differences between SoCs also contribute to differences in test pattern activities for re-use interfaces.

Therefore, some test patterns for testing re-use interfaces must be regenerated. Regenerating test patterns is a cumbersome and laborious task that entails converting each interface activity into a tester format, stabilizing the tester formats across various process-voltage-temperature (PVT) corners, and defining new tester equations. Such efforts have a direct impact on the test costs and time-to-market.

Therefore, it would be advantageous to have a test system that eliminates the additional effort required for regenerating test patterns.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

Figure 1:
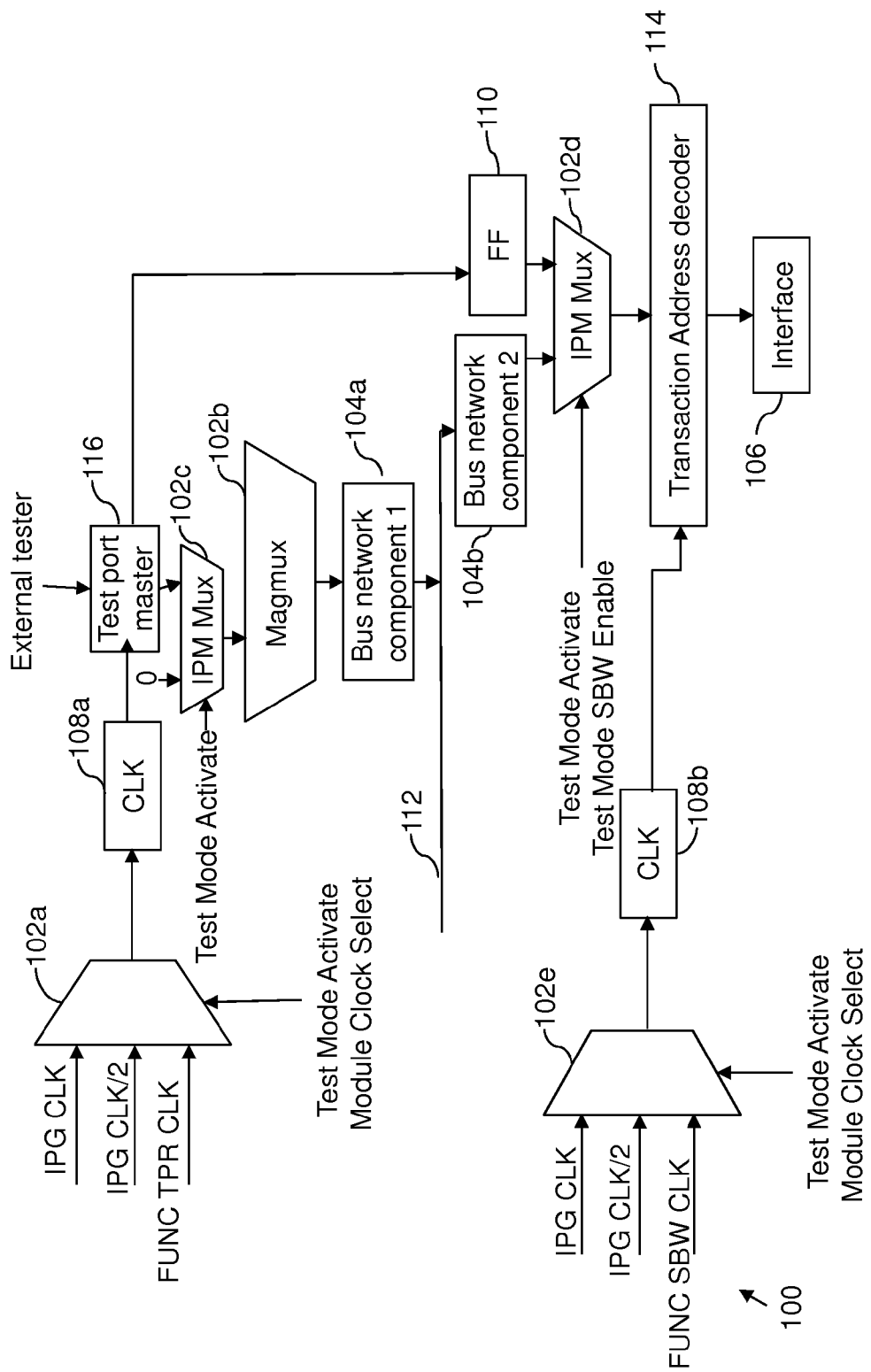
FIG. 1 is a schematic block diagram of a portion of a SoC including a first standard interface and test circuitry therefor in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a system for testing standard interfaces of an electronic circuit is provided. The system includes a first multiplexer for receiving a plurality of clock signals and selectively transmitting a first clock signal, based on a first test mode enable signal, a module clock select signal, and a test mode activate signal. The first multiplexer is connected to a test port master that receives test patterns from an external testing apparatus, based on the first clock signal. The test port master and a first bus network component are connected to a second multiplexer that receives and selectively transmits the test patterns and a first bus network signal, based on the first test mode enable signal, and the test mode activate signal. The second multiplexer is connected to a first standard interface that connects the electronic circuit to an external device. The first standard interface is further connected to the test port master through the second multiplexer, to bypass the first bus network component when the test mode activate signal and the first test mode enable signal are asserted. The test port master and the first standard interface are configured to operate in a master and a slave configuration, respectively, when the test mode activate signal and the first test mode enable signal are asserted.

The first standard interface is connected to a third multiplexer that receives the plurality of clock signals and selectively transmits a second clock signal, based on the test mode activate signal, the first test mode enable signal, and the module clock select signal. A fourth multiplexer is connected between the test port master and a second bus network component for receiving and selectively transmitting the test patterns and a second bus network signal, based on the test mode activate signal, and a second test mode enable signal. A second standard interface is connected to the fourth multiplexer for connecting the electronic circuit to an external memory device. The second standard interface is further connected to the test port master through the fourth multiplexer to bypass the second bus network component when the test mode activate signal and the second test mode enable signal are asserted.

In another embodiment of the present invention, a system for testing standard interfaces of an electronic circuit is provided. The system includes a first multiplexer for receiving a plurality of clock signals and selectively transmitting a first clock signal based on a test mode activate signal, a first test mode enable signal, and a module clock select signal. The system further includes a test port master connected to the first multiplexer for receiving test patterns from an external testing apparatus, based on the first clock signal. A second multiplexer is connected to the test port master and a first bus network component for receiving and selectively transmitting the test patterns and a first bus network signal, based on the test mode activate signal and the first test mode enable signal. A first standard interface is connected to the second multiplexer for connecting the electronic circuit to an external device. The first standard interface is further connected to the test port master through the second multiplexer to bypass the first bus network component when the test mode activate signal and the first test mode enable signal are asserted. The test port master and the first standard interface are configured to operate in a master and a slave configuration, respectively, when the test mode activate signal and the first test mode enable signal are asserted. A third multiplexer is connected to the first standard interface, for receiving the plurality of clock signals and selectively transmitting a second clock signal, based on the test mode activate signal, the first test mode enable signal, and the module clock select signal. The system includes a test port slave for receiving the test patterns from the external testing apparatus. The test port slave and a second bus network component are connected to a de-multiplexer for receiving and selectively transmitting the test patterns and a second bus network signal, based on the test mode activate signal and a second test mode enable signal. A second standard interface is connected to the de-multiplexer for connecting the electronic circuit to the external device. The second standard interface is further connected to the test port slave through the de-multiplexer to bypass the second bus network component when the test mode activate signal and the second test mode enable signal are asserted. The second standard interface and the test port slave are configured to operate in a master and slave configuration, respectively, when the test mode activate signal and the second test mode enable signal are asserted.

In yet another embodiment of the present invention, a system for testing standard interfaces of an electronic circuit is provided. The system includes a first multiplexer for receiving a plurality of clock signals and selectively transmitting a first clock signal, based on a first test mode enable signal, a module clock select signal, and a test mode activate signal. The first multiplexer is connected to a test port master that receives test patterns from an external testing apparatus, based on the first clock signal. The test port master and a first bus network component are connected to a second multiplexer that receives and selectively transmits the test patterns and a first bus network signal, based on the first test mode enable signal and the test mode activate signal. The second multiplexer is connected to a first standard interface that connects the electronic circuit to an external device. The first standard interface is further connected to the test port master through the second multiplexer, to bypass the first bus network component when the test mode activate signal and the first test mode enable signal are asserted. The test port master and the first standard interface are configured to operate in a master and a slave configuration, respectively, when the test mode activate signal and the first test mode enable signal are asserted.

The first standard interface is connected to a third multiplexer that receives the plurality of clock signals and selectively transmits a second clock signal, based on the test mode activate signal, the first test mode enable signal, and the module clock select signal. A fourth multiplexer is connected between the test port master and a second bus network component for receiving and selectively transmitting the test patterns and a second bus network signal respectively, based on the test mode activate signal and a second test mode enable signal. A second standard interface is connected to the fourth multiplexer for connecting the electronic circuit to an external memory device. The second standard interface is further connected to the test port master through the fourth multiplexer to bypass the second bus network component when the test mode activate signal and the second test mode enable signal are asserted.

The system includes a test port slave for receiving the test patterns from the external testing apparatus. The test port slave and a third bus network component are connected to a de-multiplexer for receiving and selectively transmitting the test patterns and a third bus network signal, based on the test mode activate signal and a third test mode enable signal. A third standard interface is connected to the de-multiplexer for connecting the electronic circuit to the external device. The third standard interface is further connected to the test port slave through the de-multiplexer to bypass the third bus network component when the test mode activate signal and the third test mode enable signal are asserted. The third standard interface and the test port slave are configured to operate in a master and slave configuration, respectively, when the test mode activate signal and the third test mode enable signal are asserted.

Various embodiments of the present invention provide a system for testing standard interfaces of an electronic circuit. The system includes first, second, and third standard interfaces. The system further includes a test port master and a test port slave that are connected to an external testing apparatus. The first, second, and third standard interfaces are tested in first, second, third test modes, respectively and the test modes are initiated based on corresponding first, second, and third test mode enable signals and a test mode activate signal. A direct connection is established between the test port master/slave and a corresponding standard interface based on the test mode activate signal and one of the first, second, third test mode enable signals. The direct connection bypasses the bus network of the electronic circuit. Since the test patterns do not traverse through the electronic circuit's bus network/logic, the variable latencies in the test patterns are eliminated. Thus, identical standard interfaces installed in different electronic circuits respond identically to the same test patterns when the direct test mode signal path is used for testing the standard interfaces. The test patterns remain cycle accurate and can be reused across different electronic circuits, thereby eliminating the onerous tasks associated with regenerating test patterns. Thus, the cost and time associated with testing electronic circuits is reduced.

In an embodiment of the present invention, the test mode signal paths operate on a common frequency by supplying externally generated reference clock signals (to a phase-locked loop (PLL) of the electronic circuit) along with PLL multiplication factors using which clock signals with desired frequency are generated. The use of a common frequency enables reuse of the test patterns across various electronic circuits, since all test mode signal paths (of different electronic circuits) operate effectively on the same frequency. Using clock signals with desired frequency enables reusability of the test patterns across different electronic circuits. Different electronic circuits may have different reset sequences and POR values. The variation is overcome by appending a reset sequence associated with the electronic circuit under test, with the test patterns, thereby ensuring reuse of test patterns. Further, electronic circuits may have a differing pin-multiplexing arrangement. This difference is overcome by re-assigning the standard interface signals to the corresponding pins of the electronic circuit under test, thereby allowing reuse of the test patterns.

Referring now to FIG. 1, a schematic block diagram of a portion of a SoC 100 including a first standard interface 106 and test circuitry therefor in accordance with an embodiment of the present invention is shown. The first standard interface 106 is tested in a first mode. The SoC 100 includes a plurality of multiplexers including first through fifth multiplexers or muxes 102a-102e, first and second bus network components 104a and 104b, first and second clock generating modules 108a and 108b, a set of flip-flops 110, a bus or transmission line 112, a transaction address decoder 114, and a test port master 116.

The first mux 102a receives a set of clock signals shown as IPG_CLK, IPG_CLK/2 and FUNC_TPR_CLK. In an embodiment of the present invention, IPG_CLK and IPG_CLK/2 are used in the first test mode, and FUNC_TPR_CLK is used in normal functional mode of the SoC 100. The IPG_CLK clock signal may be generated by a phase locked loop (PLL) of the SoC 100 and IPG_CLK/2 may be derived from IPG_CLK with a clock divider (not shown). Other clock signals of different frequencies also may be input to the first mux 102a and such other clock signals may be derived from IPG_CLK so that testing may be performed using a clock signal of a selected frequency as discussed in more detail below.

A test mode activate signal is asserted and transmitted to the first, third, fourth, and fifth muxes 102a, 102c, 102d, and 102e and a first test mode enable signal (Test Mode SBW Enable) is asserted and also transmitted to the fourth mux 102d at the beginning of the first test mode. In an embodiment of the present invention, the test mode activate and first test mode enable signals are generated by an external testing apparatus (not shown) connected to the SoC 100. In another embodiment of the present invention, the first test mode activate and enable signals are generated by control logic within the SoC 100.

The first standard interface 106 includes associated configuration registers that are configured for performing test transactions. Examples of the first standard interface 106 include a synchronous serial interface (SSI), a serial peripheral interface (SPI), a time-division multiplexing (TDM) interface, an enhanced secure digital host controller (eSDHC) interface, a Flexcan interface, an inter-integrated circuit (I2C) interface, a dual universal asynchronous receiver/transmitter (Duart) interface, and a general purpose input/output (GPIO) interface. The SoC 100 may include multiple first standard interfaces 106 that are tested sequentially when the first test mode is enabled. Additionally, a module clock select signal is generated by the external testing apparatus and transmitted to the first and fifth muxes 102a and 102e.

The first mux 102a selects a clock signal from the set of clock signals, based on the test mode activate, first test mode enable (i.e., test_mode_SBW_enable), and module clock select signals. An output terminal of the first mux 102a is connected to the first clock generating module 108a and the selected clock signal is transmitted to the first clock generating module 108a. It should be noted that the first clock generating module 108a also could gate the clock signals in a design-for-test (DFT) mode and the selected clock signal may be multiplexed with a DFT mode clock if the SoC 100 includes DFT logic. The output of the first clock generating module 108a (output clock signal) is transmitted to the test port master 116. The test port master 116 operates using the output clock signal. The ability to select a clock signal of a desired frequency from multiple clock signals provides the flexibility to use a clock signal that has the same frequency as that of the first standard interface 106. Thus, a signal path for the first test mode from the test port master 116 to the first standard interface 106 operates at a common frequency.

The test port master 116 may be connected to the first standard interface 106 through either a SoC bus network path or the first test mode signal path. The SoC bus network path includes the third mux 102c, the second mux 102b, the first bus network component 104a, the transmission line 112, the second bus network component 104b, the fourth mux 102d, and the transaction address decoder 114. On the other hand, the first test mode signal path includes the set of flip-flops 110, the fourth mux 102d, and the transaction address decoder 114. The first and second bus network components 104a and 104b convert signals from a first bus protocol to a second bus protocol. For example, the first bus network component 104a may convert a 'magenta' bus protocol signal to a transmission line signal that is transmitted over the transmission line 112 to the second bus network component 104b, and then the second bus network component 104b converts the transmission line signal back to the magenta protocol signal. The magenta bus protocol is a proprietary bus protocol of Freescale Semiconductor, Inc. of Austin, Tex. The set of flip-flops 110 are used to adjust the timing of the signals traversing the first test mode signal path.

The test mode activate signal causes the third mux 102c to transmit inactive values to the second mux 102b in order to indicate that the first test mode is activated and commands from the test port master 116 will traverse the first test mode signal path instead of the functional path. Further, the first test mode enable signal causes the fourth mux 102d to select signals from the set of flip-flops 110 instead of a bus network signal from the second bus network component 104b and transmit the output signal to the transaction address decoder 114. In an embodiment of the present invention, the fourth mux 102d is an IPM multiplexer, which means that the mux receives IPM (Internetwork Performance Monitor) protocol signals and passes the selected signal. During the first test mode, the test port master 116 is loaded with test patterns generated by the external testing apparatus. The test patterns are transmitted by way of the set of flip-flops 110 to the fourth mux 102d. As mentioned above, the fourth mux 102d selects the signals from the set of flip-flops 110 and transmits the selected signals to the transaction address decoder 114.

The transaction address decoder 114 receives a clock signal from the second clock generating module 108b. The second clock generating module 108b is used to gate clock signals selected by the fifth mux 102e in the DFT mode similar to the way the first clock generating module 108a gates clock signals. The fifth mux 102e receives IPG_CLK, IPG_CLK/2, and a functional 'skyblue' clock signal (FUNC_SBW_CLK) and selects one of these clock signals based on the test mode activate signal, the first test mode enable signal, and the module clock select signal.

The transaction address decoder 114 functions using the clock signal from the second clock generating module 108b and decodes the destination address (in case the SoC 100 has multiple first standard interfaces 106) to which the test patterns are destined. The transaction address decoder 114 communicates with both configuration and data paths (not shown separately in the FIG. 1) of the first standard interface 106 during the first test mode. Additionally, in one embodiment of the invention, the transaction address decoder 114 converts the magenta protocol signals received from the fourth mux 102d to skyblue protocol signals. Like magenta, skyblue also is a proprietary bus protocol of Freescale Semiconductor, Inc. In this manner, the test patterns reach respective first standard interfaces 106 through the first test mode signal path. Since the test patterns do not traverse the SoC bus network path, SoC architecture dependent latencies are not introduced in the test patterns. Thus, identical standard interfaces installed in different SoCs will respond identically to the same test patterns when the first test mode signal path is used for testing the standard interfaces and thus, test patterns can be re-used across multiple SoCs.

Further, the test mode signal path is operated on a common frequency by providing externally generated reference clock signals to the PLL in the SoC 100 along with PLL multiplication parameters. Using the reference clock signals and the PLL multiplication parameters, clock signals with a desired frequency, such as IPG_CLK, IPG_CLK/2 are generated. Since all test mode signal paths (of multiple SoCs) operate effectively at the same frequency, the test patterns can be re-used across multiple SoCs. Providing clock signals with at a desired frequency and a desired multiplication factor facilitates re-usability of the test patterns. The differences in the reset sequence and the POR (power on reset) values are overcome by appending a reset sequence associated with a SoC being tested with the test patterns. Further, the differing pin-multiplexing arrangement is overcome by re-assigning the standard interface signals to the corresponding pins of the SoC being tested.

After providing the test patterns to the first standard interface 106, the external testing apparatus receives response or output data from the SoC 100 and compares the received data with stored, expected data, to check for faults. The processes of decoding the destination address and comparing data patterns are well-known in the art and a detailed description has been excluded from the present description so as not to obscure the inventive concepts herein.

Figure 2:
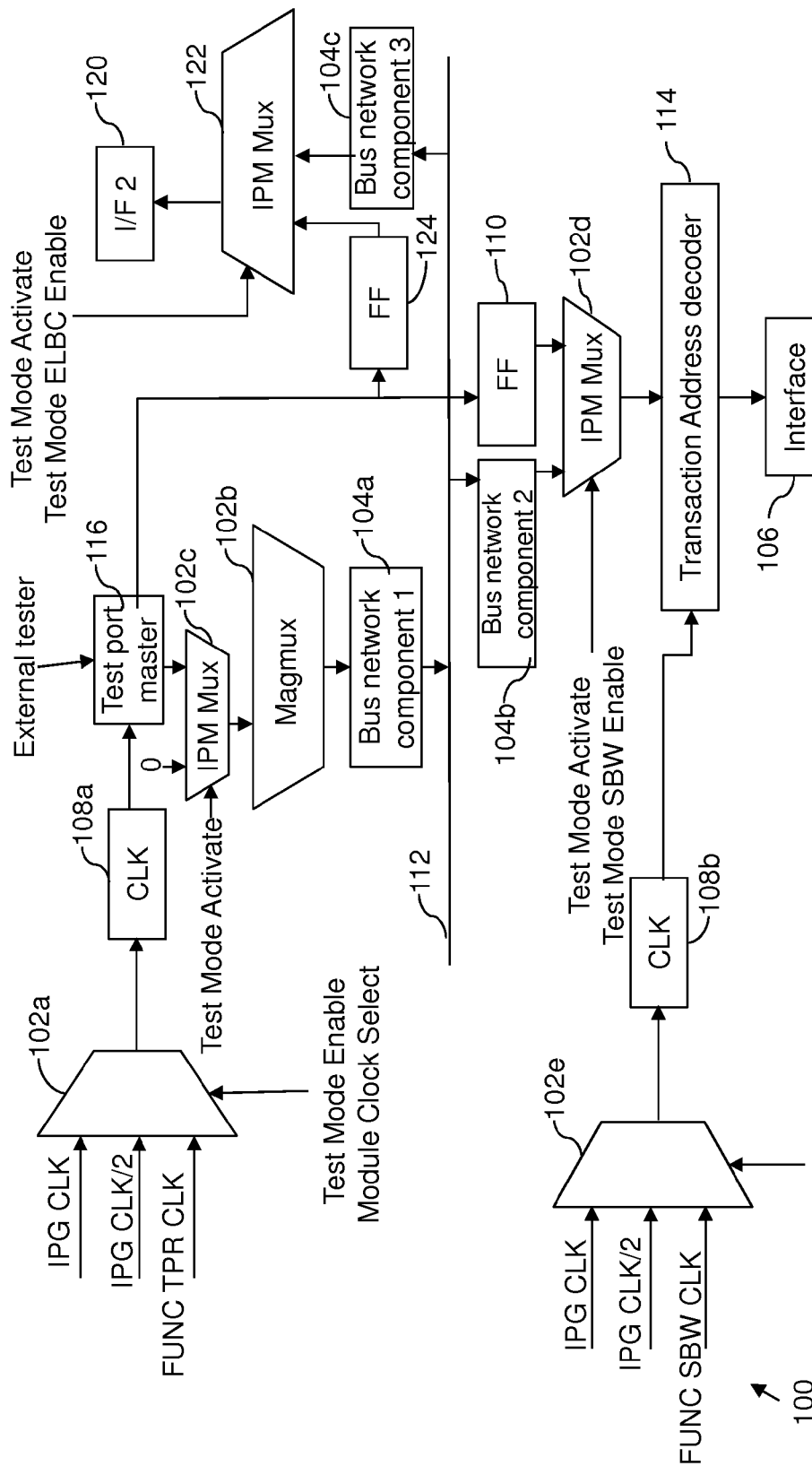
FIG. 2 is a schematic block diagram of a portion of the SoC of FIG. 1 including a second standard interface and test circuitry therefor in accordance with an embodiment of the present invention.

Referring now to FIG. 2, a schematic diagram of the SoC 100 illustrating additional circuitry for testing a second standard interface 120 when the SoC 100 is in a second test mode, in accordance with another embodiment of the present invention, is shown. The additional circuitry for operating in the second test mode includes a second test mode signal path for testing the second standard interface 120. In addition to the elements shown in FIG. 1, the SoC 100 includes a sixth mux 122, a third bus network component 104c, and a second set of flip-flops 124.

The second standard interface 120 is a slave interface that initially requires configuring configuration registers (i.e., the first standard interface 106) associated therewith using the first test mode signal path. That is, the configuration registers are a set of registers inside the second standard interface 120 that are used to configure the first standard interface 106. Thereafter, a master issues read/write instructions to the second standard interface 120, and the second standard interface 120 transmits the read/write instructions to an external device (not shown). Examples of the second standard interface 120 include an enhanced local bus controller (ELBC) interface, an integrated flash controller (IFC) interface, and a double data rate (DDR) interface. The external devices may include NOR/NAND flash memories, static random access memory (SRAM) memories, and DDR memories.

The first test mode is initiated in order to configure the second standard interface 120 before initiating the second test mode. The first test mode enables the first test mode signal path that extends from the test port master 116 to the configuration registers of the second standard interface 120. The test port master 116 operates on a clock signal transmitted by the first clock generating module 108a, as previously discussed, and the first test mode signal path is used to initialize the configuration registers of the second standard interface 120.

Subsequently, the second test mode is initiated by asserting a second test mode enable signal. In an embodiment of the present invention, the second test mode enable signal is generated by the external testing apparatus and transmitted to the sixth mux 122. In another embodiment of the present invention, the second test mode enable signal is generated by control logic within the SoC 100. First and second input terminals of the sixth mux 122 are connected to the second set of flip-flops 124 and the third bus network component 104c, respectively. The second set of flip-flops 124 are connected to the test port master 116. The test port master 116 transmits test patterns (received from the external testing apparatus) to the sixth mux 122 by way of the second set of flip-flops 124. The second set of flip-flops 124 are provided to adjust the timing of the signals received from the test port master 116. The second test mode enable signal causes the sixth mux 122 to transmit signals received from the second set of flip-flops 124 instead of those received from the third bus network component 104c.

The third bus network component 104c transmits bus network signals received from the first bus network component 104a by way of the transmission line 112 to the sixth mux 122. The first and third bus network components 104a and 104c convert signals from a first bus protocol to a second bus protocol, such as from and to the magenta bus protocol previously discussed.

Once the signals from the second set of flip-flops 124 are selected, the sixth mux 122 transmits the selected signals to the second standard interface 120. In an embodiment of the present invention, the sixth mux 122 is an IPM multiplexer. The additional hardware/circuitry shown in FIG. 2 provides a second test mode signal path that extends from the test port master 116 to the second standard interface 120 via the sixth mux 122. The second test mode signal path bypasses the SoC functional bus network that extends through the first and third bus network components 104a and 104c and enables direct transmission of the test patterns from the test port master 116 to the second standard interface 120.

Similar to the first test mode signal path, the second test mode signal path bypasses the SoC bus network and eliminates the SoC architecture dependent latencies that could otherwise be introduced if the test patterns had to traverse the SoC bus network. As a result, the test patterns can be re-used for testing standard interfaces 120 across different SoCs. The differences in the reset sequence and the POR values are overcome by appending a reset sequence associated with a SoC being tested with the test patterns. Further, the differing pin-multiplexing arrangement is overcome by re-assigning the standard interface signals to the corresponding pins of the SoC being tested, thereby enabling re-use of the test patterns. The first and fifth muxes 102a and 102e select a clock signal of a desired frequency allowing the test port master 116 to operate at the same frequency as that of the second standard interface 120, which also facilities test pattern re-use.

Figure 3:
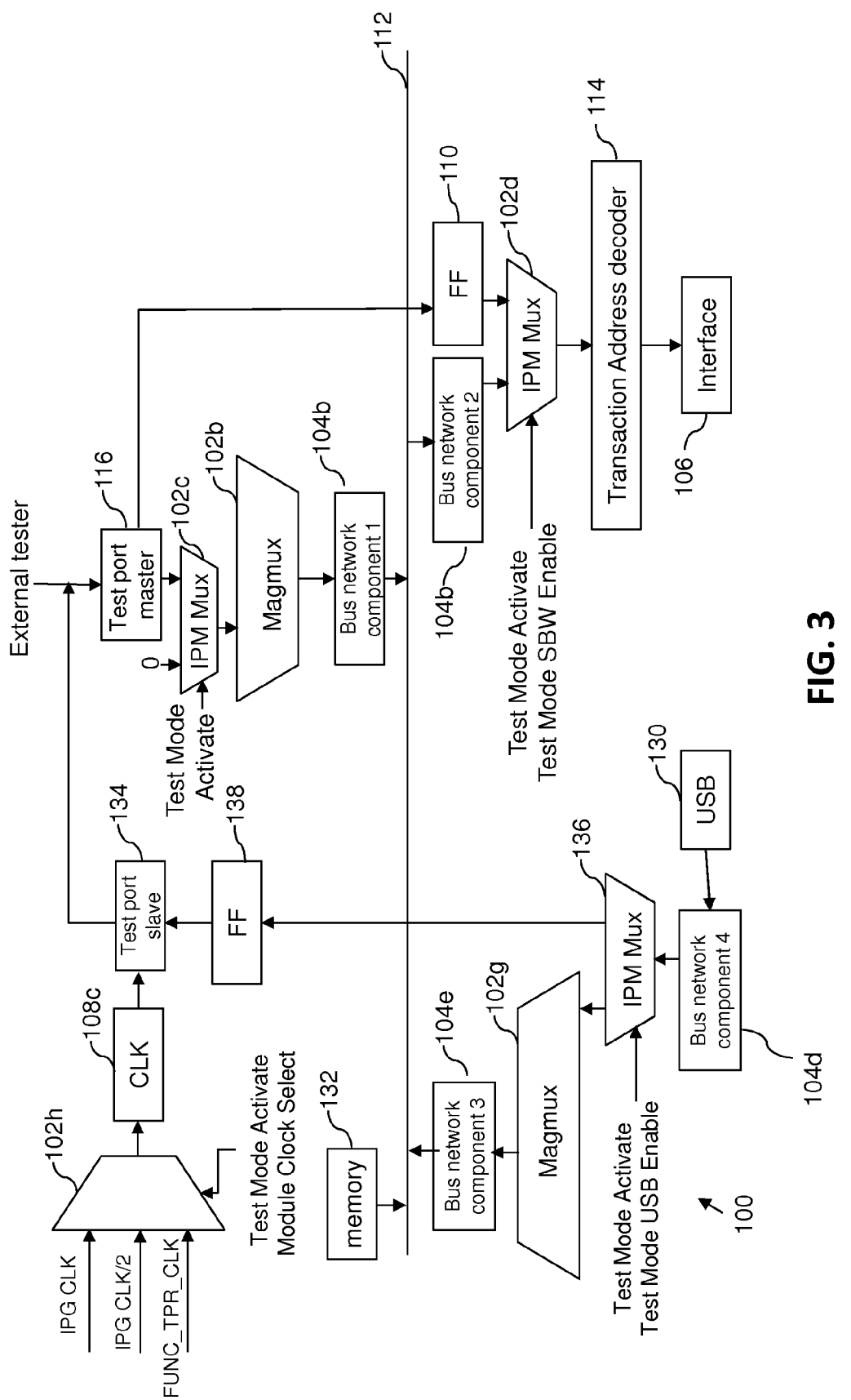
FIG. 3 is a schematic block diagram of a portion of the SoC of FIG. 1 including a third standard interface and test circuitry therefor in accordance with an embodiment of the present invention.

Referring now to FIG. 3, a schematic diagram of the SoC 100 including additional circuitry for testing a third standard interface 130 when in a third test mode, in accordance with yet another embodiment of the present invention, is shown. The additional circuitry enabling the third test mode defines a third test mode signal path for testing the third standard interface 130. The additional circuitry includes seventh and eighth muxes 102g and 102h, fourth and fifth bus network components 104d and 104e, a third clock generating module 108c, a memory 132, a test port slave 134, a de-multiplexer 136, and a third set of flip-flops 138.

The third standard interface 130 is a master interface that initially requires configuring the configuration registers (discussed above) associated therewith. After being configured, the third standard interface 130 accesses the memory 132 to read data descriptors for performing further transactions. Examples of the third standard interface 130 include an USB interface, an enhanced triple-speed Ethernet controller (ETSEC)/1588 interface, and a display interface unit (DIU). The above interfaces are used for connecting the SoC 100 to external devices including sensors, control devices, cameras, real-time clocks, display devices, flash memories, and USB memory devices. In an embodiment of the present invention, the memory 132 is a L2-cache memory.

The first test mode is initiated to configure the third standard interface 130 before the third test mode is activated. The first test mode is used to provide the first test mode signal path that extends from the test port master 116 to the configuration registers. The test port master 116 operates using a clock signal provided by the first clock generating module 108a, as explained with reference to FIG. 1. The third standard interface 130 is connected to the fourth bus network component 104d which in turn is connected to the de-multiplexer 136. In an embodiment of the present invention, the de-multiplexer 136 is an IPM de-multiplexer. The fourth bus network component 104d converts advanced high-performance bus (AHB) protocol signals to magenta bus protocol signals. A first output terminal of the de-multiplexer 136 is connected to the memory 132 via the seventh mux 102g, the fifth bus network component 104e, and the transmission line 112. The fifth bus network component 104e converts a magenta bus protocol signal to a transmission line signal. The seventh mux 102g is a magenta bus protocol multiplexer. A second output terminal of the de-multiplexer 136 is connected to the test port slave 134 through the third set of flip-flops 138. The third set of flip-flops 138 are used to adjust the timing of the signals transmitted by the de-multiplexer 136.

Subsequent to configuration of the third standard interface 130, a third test mode enable signal (Test Mode USB Enable) is asserted to initiate the third test mode. In an embodiment of the present invention, the third test mode enable signal is generated by the external testing apparatus connected to the SoC 100. In another embodiment of the present invention, the third test mode enable signal is generated by control logic within the SoC 100. The third test mode enable signal is transmitted to the de-multiplexer 136 and causes the de-multiplexer 136 to transmit inactive values to the seventh mux 102g and transmit signals received from the fourth bus network component 104d to the third set of flip-flops 138.

A third test mode signal path is defined that extends from the third standard interface 130 to the test port slave 134, bypassing the bus network path that includes the seventh mux 102g and the fifth bus network component 104e.

After the third test mode is initiated, the third standard interface 130 issues and transmits read/write transaction commands to the fourth bus network component 104d. The fourth bus network component 104d transmits the read/write transaction commands to the test port slave 134 using the third test mode signal path. The third clock generating module 108c receives the clock signal selected by the eighth mux 102h. The eighth mux 102h selects a clock signal from the received clock signals IPG_CLK, IPG_CLK/2, and FUNC_TPR_CLK, and the test port slave 134 operates using the clock signal provided by the third clock generating module 108c.

The test port slave 134 transmits the read/write transaction commands received from the fourth bus network component 104d to the external testing apparatus. Thereafter, the external testing apparatus provides data descriptors and transaction data in response to the read/write transaction commands. Based on the address locations of the data in the data descriptor, further data transactions are performed by the third standard interface 130. Faults in the third standard interface 130 are determined based on the accuracy of communication between the third standard interface 130 and the external testing apparatus.

Similar to the first test mode signal path, the third test mode signal path bypasses the SoC bus network and eliminates the SoC architecture dependent latencies that otherwise would have been introduced had the test patterns traversed the SoC bus network. As a result, the test patterns for testing third standard interfaces 130 can be re-used by different SoCs. The differences in the reset sequence and the POR values are addressed by appending a reset sequence that is associated with the SoC being tested. Further, the differing pin-multiplexing arrangement is overcome by re-assigning the third standard interface 130 signals to the corresponding pins of the SoC being tested, thereby facilitating test pattern re-use.

The first and eighth muxes 102a and 102h select a clock signal of a desired frequency, which allows the test port slave 134 to operate at the same frequency as that of the third standard interface 130, which also facilitates test pattern re-use.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What is claimed is:

1. A system for testing standard interfaces of an electronic circuit, comprising:
   a first multiplexer for receiving a plurality of clock signals and selectively transmitting a first clock signal, based on a first test mode enable signal, a module clock select signal, and a test mode activate signal;
   a test port master, connected to the first multiplexer, for receiving at least one test pattern from an external testing apparatus, based on the first clock signal;
   a second multiplexer, connected to the test port master and a first bus network component, for receiving and selectively transmitting the at least one test pattern and a first bus network signal respectively, based on the first test mode enable signal, and the test mode activate signal;
   a first standard interface, connected to the second multiplexer, for connecting the electronic circuit to an external device, wherein the first standard interface is further connected to the test port master through the second multiplexer to bypass the first bus network component when the test mode activate signal and the first test mode enable signal are asserted, and wherein the test port master and the first standard interface are configured to operate in a master and a slave configuration, respectively, when the test mode activate signal and the first test mode enable signal are asserted;
   a third multiplexer, connected to the first standard interface, for receiving the plurality of clock signals and selectively transmitting a second clock signal, based on the test mode activate signal, the first test mode enable signal, and the module clock select signal;
   a fourth multiplexer, connected to the test port master and a second bus network component for receiving and selectively transmitting the at least one test pattern and a second bus network signal respectively, based on the test mode activate signal, and a second test mode enable signal; and
   a second standard interface, connected to the fourth multiplexer, for connecting the electronic circuit to an external memory device, wherein the second standard interface is further connected to the test port master through the fourth multiplexer to bypass the second bus network component when the test mode activate signal, and the second test mode enable signal are asserted.

2. The system of claim 1, further comprising:
a first clock generation module, connected to the first multiplexer and the test port master, for gating the first clock signal and altering a frequency of the first clock signal;
a first set of flip-flops, connected to the test port master and the second multiplexer, for optimizing timing of the at least one test pattern;
a second set of flip-flops, connected to the test port master and the fourth multiplexer, for optimizing timing of the at least one test pattern;
a transaction address decoder, connected to the second multiplexer and the first set of flip-flops, for decoding an address of a destination interface of the at least one test pattern;
a second clock generation module, connected to the third multiplexer and the transaction address decoder, for gating the second clock signal and altering a frequency of the second clock signal;
a test port slave for receiving the at least one test pattern from the external testing apparatus;
a demultiplexer, connected to the test port slave and a third bus network component for receiving and selectively transmitting the at least one test pattern and a third bus network signal respectively, based on a third test mode enable signal, and the test mode activate signal;
a third set of flip-flops, connected to the test port slave and the demultiplexer, for optimizing timing of the at least one test pattern; and
a third standard interface, connected to demultiplexer, for connecting the electronic circuit to the external device, wherein the third standard interface is further connected to the test port slave through the demultiplexer to bypass the third bus network component when the test mode activate signal, and the third test mode enable signal are asserted, and wherein the third standard interface and the test port slave are configured to operate in a master and slave configuration, respectively, when the test mode activate signal, and third test mode enable signal are asserted.

3. The system of claim 2, wherein the third standard interface is one of an universal serial bus (USB) interface, an enhanced triple-speed Ethernet controller (ETSEC)/1588 interface, and a display interface unit (DIU) interface.

4. The system of claim 2, wherein each of the first, second and third bus network components operate according to one of an advanced high-performance bus (AHB) standard, an advanced peripheral bus (APB) standard, an advanced eXtensible interface (AXI), a bi-first in, first out bus architecture (BFBA) standard, a global bus I architecture (GBIA) standard, a global bus II architecture (GBIIA) standard, and a crossbar switch bus architecture (CSBA) standard.

5. The system of claim 4, wherein each of the first, second, and third bus network components are used for one of converting a first bus network standard into a second bus network standard, converting a frequency of one or more bus network signals, and connecting one or more electronic circuit modules.

6. The system of claim 1, wherein the first standard interface is one of a synchronous serial interface (SSI), a serial peripheral interface (SPI), a time-division multiplexing (TDM) interface, an enhanced secure digital host controller (eSDHC) interface, a Flexcan interface, an inter-integrated circuit (I2C) interface, a dual universal asynchronous receiver/transmitter (Duart) interface, and a general purpose input/output (GPIO) interface.

7. The system of claim 1, wherein the second standard interface is one of an enhanced local bus controller (ELBC) interface, an integrated flash controller (IFC) interface, and a double data rate (DDR) interface.

8. The system of claim 1, wherein the external device comprises one of a sensor, a control device, a camera, a real-time clock, and a display device.

9. The system of claim 1, wherein the external memory device is one of a double data rate (DDR) memory device, a NOR/NAND flash memory, a static random access memory (SRAM), and an universal serial bus (USB) memory device.

10. A system for testing standard interfaces of an electronic circuit, comprising:
a first multiplexer for receiving a plurality of clock signals and selectively transmitting a first clock signal, based on a test mode activate signal, a first test mode enable signal, and a module clock select signal;
a test port master, connected to the first multiplexer, for receiving at least one test pattern from an external testing apparatus, based on the first clock signal;
a second multiplexer, connected to the test port master and a first bus network component for receiving and selectively transmitting the at least one test pattern and a first bus network signal respectively, based on the test mode activate signal, and the first test mode enable signal;
a first standard interface, connected to the second multiplexer, for connecting the electronic circuit to an external device, wherein the first standard interface is further connected to the test port master through the second multiplexer to bypass the first bus network component when the test mode activate signal, and the first test mode enable signal are asserted, and wherein the test port master and the first standard interface are configured to operate in a master and a slave configuration, respectively, when the test mode activate signal, and the first test mode enable signal are asserted;
a third multiplexer, connected to the first standard interface, for receiving the plurality of clock signals and selectively transmitting a second clock signal, based on the test mode activate signal, the first test mode enable signal, and the module clock select signal;
a test port slave for receiving the at least one test pattern from the external testing apparatus;
a demultiplexer, connected to the test port slave and a second bus network component for receiving and selectively transmitting the at least one test pattern and a second bus network signal respectively, based on the test mode activate signal, and a second test mode enable signal; and
a second standard interface, connected to the demultiplexer, for connecting the electronic circuit to the external device, wherein the second standard interface is further connected to the test port slave through the demultiplexer to bypass the second bus network component when the test mode activate signal, and the second test mode enable signal are asserted, and wherein the second standard interface and the test port slave are configured to operate in a master and slave configuration, respectively, when the test mode activate signal, and the second test mode enable signal are asserted.

11. The system of claim 10, further comprising:
a fourth multiplexer, connected to the test port master and a third bus network component for receiving and selectively transmitting the at least one test pattern and a third bus network signal respectively, based on the test mode activate signal, and a third test mode enable signal; and a third standard interface, connected to the fourth multiplexer, for connecting the electronic circuit to an external memory device, wherein the third standard interface is further connected to the test port master through the fourth multiplexer to bypass the third bus network component, when the test mode activate signal, and the third test mode enable signal are asserted.

12. The system of claim 11, wherein the third standard interface is one of an enhanced local bus controller (ELBC) interface, an integrated flash controller (IFC) interface, and a double data rate (DDR) interface.

13. The system of claim 11, wherein the external memory device is a double data rate (DDR) memory device, a NOR/NAND flash memory, a static random access memory (SRAM), and an universal serial bus (USB) memory device.

14. The system of claim 11, wherein each of the first, second and third bus network components operate according to at least one of an advanced high-performance bus (AHB) standard, an advanced extensible interface (AXI), an advanced peripheral bus (APB) standard, a bi-first in first out bus architecture (BFBA) standard, a global bus I architecture (GBIA) standard, a global bus II architecture (GBIIA) standard, and a crossbar switch bus architecture (CSBA) standard.

15. The system of claim 14, wherein each of the first, second, and third bus network components are used for at least one of converting a first bus network standard into a second bus network standard, converting a frequency of one or more bus network signals, and connecting one or more electronic circuit modules.

16. The system of claim 10, wherein the first standard interface is at least one of a synchronous serial interface (SSI), a serial peripheral interface (SPI), a time-division multiplexing (TDM) interface, an enhanced secure digital host controller (eSDHC) interface, a Flexcan interface, an inter-integrated circuit (I2C) interface, a dual universal asynchronous receiver/transmitter (Duart) interface, and a general purpose input/output (GPIO) interface.

17. The system of claim 10, wherein the second standard interface is at least one of an universal serial bus (USB) interface, an enhanced triple-speed Ethernet controller (ETSEC)/1588 interface, and a display interface unit (DIU) interface.

18. The system of claim 10, wherein the external device comprises at least one of a sensor, a control device, a camera, a real-time clock, and a display device.

19. A system for testing standard interfaces of an electronic circuit, comprising:
a first multiplexer for receiving a plurality of clock signals and selectively transmitting a first clock signal, based on a test mode activate signal, a first test mode enable signal, and a module clock select signal;
a test port master, connected to the first multiplexer, for receiving at least one test pattern from an external testing apparatus, based on the first clock signal;
a second multiplexer, connected to the test port master and a first bus network component for receiving and selectively transmitting the at least one test pattern and a first bus network signal respectively, based on the test mode activate signal, and the first test mode enable signal;
a first standard interface, connected to the second multiplexer, for connecting the electronic circuit to an external device, wherein the first standard interface is further connected to the test port master through the second multiplexer, to bypass the first bus network component when the test mode activate signal, and the first test mode enable signal are asserted, and wherein the test port master, and first standard interface and are configured to operate in a master and a slave configuration, respectively, when the test mode activate signal, and the first test mode enable signal are asserted;
a third multiplexer, connected to the first standard interface, for receiving the plurality of clock signals and selectively transmitting a second clock signal, based on the test mode activate signal, the first test mode enable signal, and the module clock select signal;
a fourth multiplexer, connected to the test port master and a second bus network component for receiving and selectively transmitting the at least one test pattern and a second bus network signal respectively, based on the test mode activate signal, and a second test mode enable signal;
a second standard interface, connected to the fourth multiplexer, for connecting the electronic circuit to an external memory device, wherein the second standard interface is further connected to the test port master through the fourth multiplexer to bypass the second bus network component, when the test mode activate signal, and the second test mode enable signal are asserted;
a test port slave for receiving the at least one test pattern from the external testing apparatus;
a demultiplexer, connected to the test port slave and a third bus network component, for receiving and selectively transmitting the at least one test pattern and a third bus network signal respectively, based on the test mode activate signal, and a third test mode enable signal; and
a third standard interface, connected to the demultiplexer, for connecting the electronic circuit to the external device, wherein the third standard interface is further connected to the test port slave through the demultiplexer to bypass the third bus network component when the test mode activate signal, and the third test mode enable signal are asserted, and wherein the third standard interface and the test port slave are configured to operate in a master and a slave configuration, respectively, when the test mode activate signal, and the third test mode enable signal are asserted.

* * * * *